(12) United States Patent
Yen et al.

(10) Patent No.: US 11,469,162 B2
(45) Date of Patent: Oct. 11, 2022

(54) PLURALITY OF VERTICAL HEAT CONDUCTION ELEMENTS ATTACHED TO METAL FILM

(71) Applicant: Richtek Technology Corporation, Zhubei (TW)

(72) Inventors: Hao-Lin Yen, Taoyuan (TW);
Heng-Chi Huang, Hsinchu (TW);
Yong-Zhong Hu, Cupertino, CA (US)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 17/356,810

(22) Filed: Jun. 24, 2021

(65) Prior Publication Data

US 2022/0181237 A1    Jun. 9, 2022

Related U.S. Application Data

(60) Provisional application No. 63/122,468, filed on Dec. 7, 2020.

(30) Foreign Application Priority Data

May 6, 2021    (TW) ................. 110116416

(51) Int. Cl.
*H01L 23/495* (2006.01)
*H01L 23/34* (2006.01)
(Continued)

(52) U.S. Cl.
CPC ........ *H01L 23/49568* (2013.01); *H01L 23/14* (2013.01); *H01L 23/3107* (2013.01);
(Continued)

(58) Field of Classification Search
CPC .......... H01L 23/49568; H01L 23/4951; H01L 23/4952; H01L 23/49541; H01L 23/3107;
(Continued)

(56) References Cited

U.S. PATENT DOCUMENTS 9,837,359 B1 * 12/2017 Chiu ..................... H01L 24/83
2010/0027225 A1 * 2/2010 Yuda .................... H05K 3/4697
156/247

(Continued)

FOREIGN PATENT DOCUMENTS

CN    103441085 A    12/2013

*Primary Examiner* — Alonzo Chambliss
(74) *Attorney, Agent, or Firm* — Tung & Associates

(57) ABSTRACT

The present invention provides a chip packaging method, which includes: providing a base material, which includes plural finger contacts; disposing plural chips on the base material by flip chip mounting technology, and disposing plural vertical heat conducting elements surrounding each of the chips to connect the finger contacts on the base material; providing a packaging material to encapsulate the base material, the chips, and the vertical heat conducting elements; adhering a metal film on the packaging material via an adhesive layer, to form a package structure; and cutting the package structure into plural chip package units, wherein each of the chip package units includes one of the chips, a portion of the base material, a portion of the metal film, and a portion of the vertical heat conducting elements surrounding the chip.

13 Claims, 8 Drawing Sheets

(51) Int. Cl.
*H01L 23/28* (2006.01)
*H01L 21/00* (2006.01)
*H05K 7/20* (2006.01)
*H01L 23/31* (2006.01)
*H01L 25/07* (2006.01)
*H01L 23/14* (2006.01)
*H01L 25/075* (2006.01)
*H01L 23/00* (2006.01)
*H01L 23/40* (2006.01)

(52) U.S. Cl.
CPC ........ *H01L 23/345* (2013.01); *H01L 23/4951* (2013.01); *H01L 23/4952* (2013.01); *H01L 23/49541* (2013.01); *H01L 24/13* (2013.01); *H01L 24/81* (2013.01); *H01L 25/072* (2013.01); *H01L 25/0753* (2013.01); *H01L 2023/405* (2013.01); *H01L 2924/181* (2013.01)

(58) Field of Classification Search
CPC ............. H01L 23/345; H01L 2023/405; H01L 2924/181; H01L 25/0753; H01L 25/072; H01L 24/81; H01L 24/16; H01L 24/13; H01L 24/97; H01L 24/14
See application file for complete search history.

(56) References Cited

U.S. PATENT DOCUMENTS

| | | | |
|---|---|---|---|
| 2011/0175213 A1* | 7/2011 | Mori | ........................ H01L 23/13 |
| | | | 257/E23.033 |
| 2013/0200509 A1* | 8/2013 | Kim | ..................... H01L 25/105 |
| | | | 257/692 |
| 2020/0058571 A1 | 2/2020 | Wang et al. | |

* cited by examiner

PLURALITY OF VERTICAL HEAT CONDUCTION ELEMENTS ATTACHED TO METAL FILM

CROSS REFERENCE

The present invention claims priority to provisional application 63/122,468 filed on Dec. 7, 2020, and TW 110116416 filed on May 6, 2021.

BACKGROUND OF THE INVENTION

Field of Invention

The present invention relates to a chip packaging method, in particular to a chip packaging method of disposing plural vertical heat conduction elements surrounding each chip unit, wherein the plural vertical heat conduction elements make thermal contacts with both of the base material and the metal film.

Description of Related Art

FIG. 1 shows a prior art chip package structure according to U.S. Pat. No. 9,984,992 wherein two chips are packaged. The lower chip unit CH is disposed on the base material 110 and inside a Faraday cage formed by plural wirings 100 and the other chip, which provides electromagnetic protection. The wirings 100 are disposed on the base material 110 and connected to the circuit/wirings embedded in the base material 110, and the wirings 100 are encapsulated in the package material 120, for resisting electromagnetic interference. According to the figure, the major heat dissipation path is from the chip unit CH downward, via the base material 110; the heat dissipation path upward is ineffective because it is too long and needs to go through the other chip.

FIG. 2 shows a prior art chip package structure according to U.S. Pat. No. 9,812,402. Similarly as FIG. 1, the wirings 100 and the conductive films 115 in FIG. 2 form a Faraday cage, wherein the wirings 100 are connected to the circuit/wirings embedded in the base material 110, to provide an electromagnetic protection structure for resisting electromagnetic interference. In this prior art, a metal cap 130 is provided over the conductive film 115; although the metal cap 130 can strengthen the protection against electromagnetic interference, it has a drawback that it causes the heat generated from the chip accumulates inside the metal cap 130, resulting in poor heat dissipation performance.

FIG. 3 shows a prior art chip package structure according to U.S. Pat. No. 7,355,289. In order to improve the heat conduction from the chip unit CH, plurality of wirings 100 are formed on the chip unit CH, wherein one end of each of the wirings 100 is exposed outside of the package material 120 above the chip unit CH. However, the heat dissipation improvement is limited because the wirings 100 are far away from the bottom plate and the exposed areas of the wirings 100 to the outside are too small.

FIG. 4 shows a prior art chip package structure according to U.S. Pat. No. 6,023,096. As shown in FIG. 4, the chip package unit includes a substrate 110 with an open space under the chip CH. Package material 100 fills in the open space under the chip CH, above a metal film 120. The metal film 120 has the benefit of enhancing the heat dissipation from the chip CH; however, the involved manufacturing steps are very complicated. The substrate 110 needs to be formed with the open space, and the metal film 120 is disposed on the package material 100 when the package material 100 is not fully hardened. The process of fitting the metal film 120 includes etching, positioning, heating, and press, all of which increase the complexity.

FIG. 5 shows a prior art chip package structure according to U.S. Pat. No. 6,411,507, in which a metal cover 130 having a complicated shape is attached on the chip CH as thermal contact for heat dissipation. Because of the complicated shape of the metal cap 140, the involved manufacturing steps are difficult. Further, how to precisely place the metal cap 140 onto the chip CH is another technical challenge. In addition, due to manufacturing restriction under the complicated shape, the metal cap 140 has a minimum size limitation that is not suitable for generally small-sized chip package structures.

In view of the above, to overcome the drawbacks of the prior art, the present invention proposes a chip package unit, which has the benefits of simple and easy manufacturing steps, low cost, and no minimum size limitation.

SUMMARY OF THE INVENTION

In one perspective, the present invention provides a chip packaging method for solving the aforementioned problems. This chip packaging method includes: providing a base material, which includes a plurality of finger contacts; disposing a plurality of chip units and a plurality of vertical heat conduction elements on the base material to surround each of the chip units, the chip units being mounted on the base material by flip chip mounting technology, and the vertical heat conduction elements are respectively disposed on and in contact with the corresponding finger contacts; providing a package material, to encapsulate the base material, the chip units and the vertical heat conduction elements; adhering a metal film on the packaging material via an adhesive layer, to form a package structure; and cutting the package structure into a plurality of chip package units, wherein each of the chip package units includes one of the chips, a portion of the base material, a portion of the metal film, and a portion of vertical heat conducting elements surrounding the chip.

In one embodiment, the steps of disposing the chip units and disposing the vertical heat conduction elements surrounding the chip units are performed by either order: first disposing the chip units and thereafter disposing the vertical heat conduction elements surrounding the chip units, or first disposing the vertical heat conduction elements and thereafter disposing the chip units in areas surrounded by the vertical heat conduction elements.

In one embodiment, the vertical heat conduction element contacts the adhesive layer or the metal film. The vertical heat conduction element can be connected to the metal film by means of the adhesive layer, or the vertical heat conduction elements can be connected to the metal film by penetrating through the adhesive layer.

In another perspective, the present invention provides a chip package unit, which includes: a base material, including a plurality of finger contacts; a chip unit, disposed on the base material by flip chip mounting technology; a plurality of vertical heat conduction elements, disposed on the finger contacts and surrounding the chip unit; a package material, encapsulating the base material, the chip unit and the vertical heat conduction elements; and an adhesive layer and a metal film, the metal film being adhered to the package material by means of the adhesive layer.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the components or units, but not drawn according to actual scale of sizes.

Figure 1:
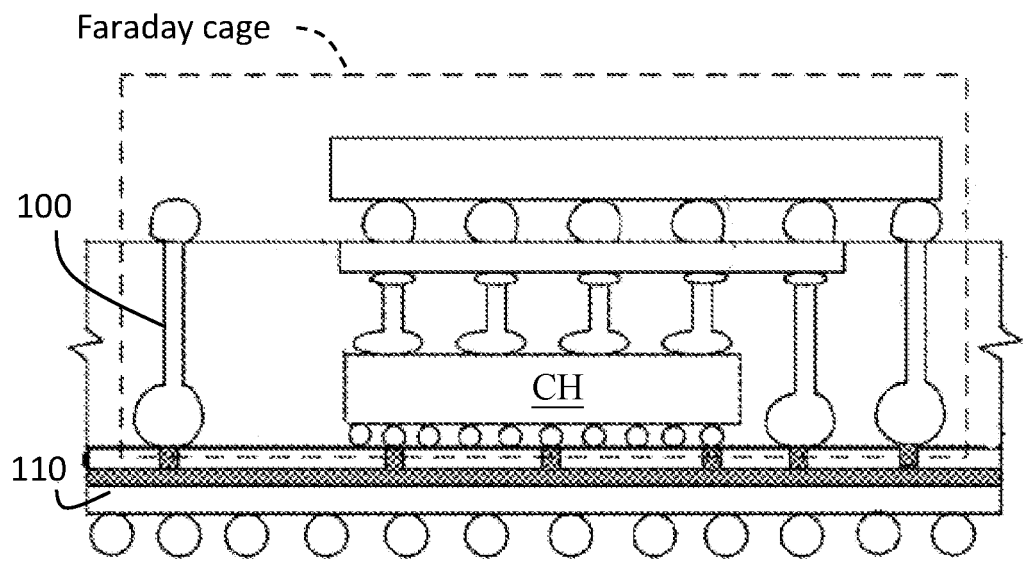
FIGS. 1 to 5 show schematic diagrams of prior art chip package structures.
Figure 2:
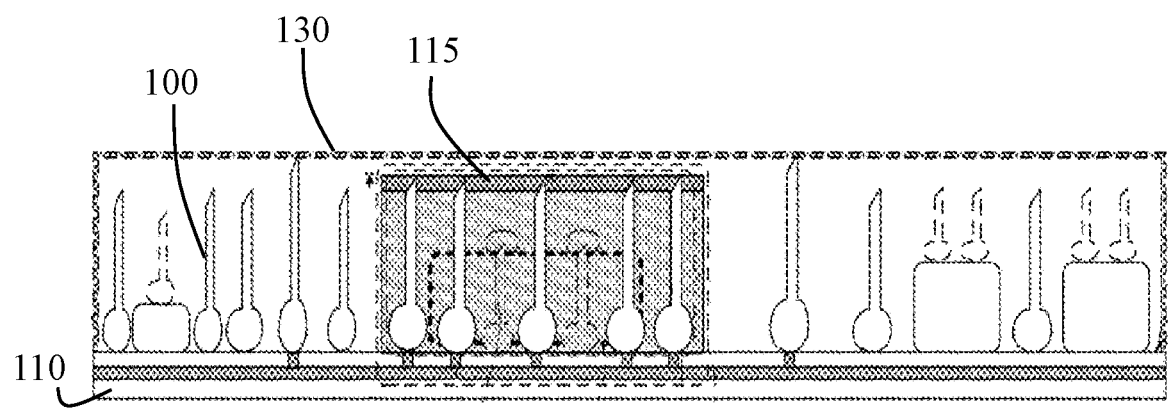
Figure 3:
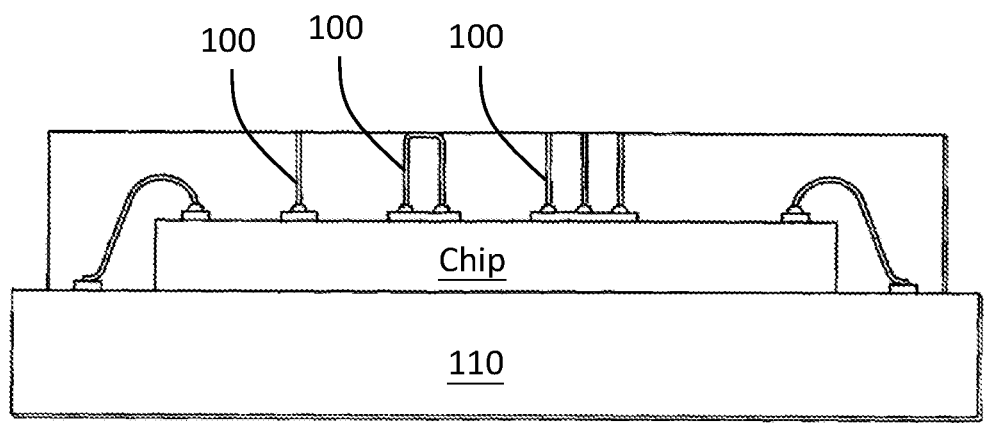
Figure 4:
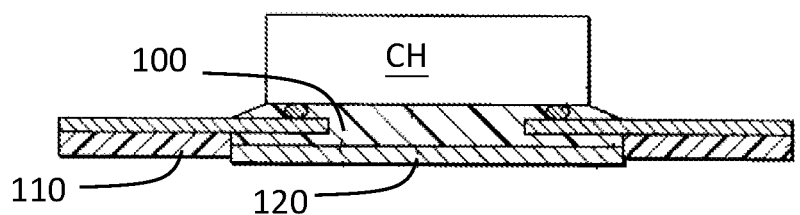
Figure 5:
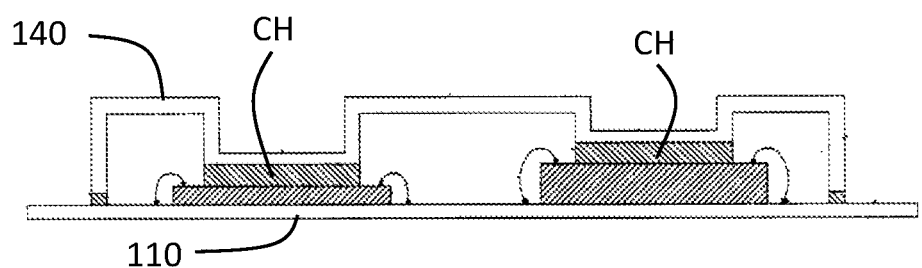
Figure 6A:
FIGS. 6A to 6G show manufacturing steps of a chip packaging method according to an embodiment of the present invention.
Figure 6B:
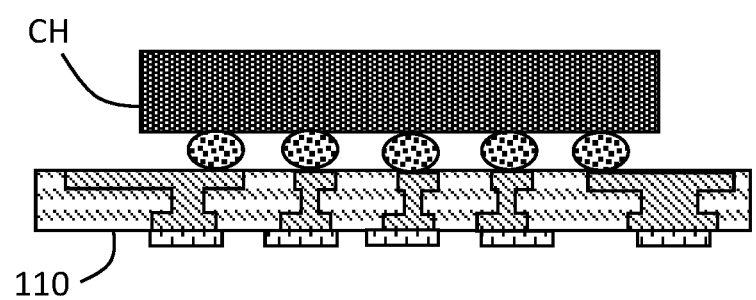
Figure 6C:
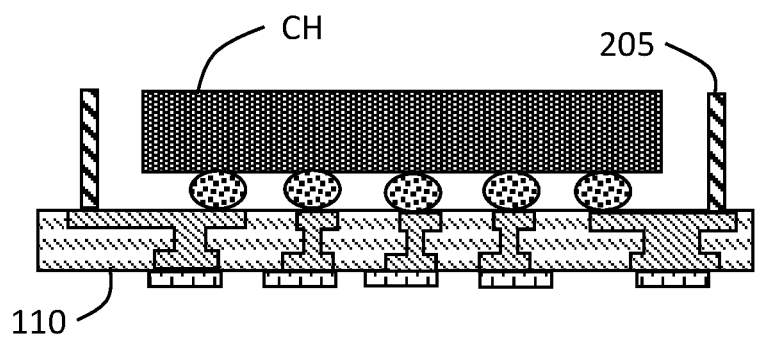
Figure 6D:
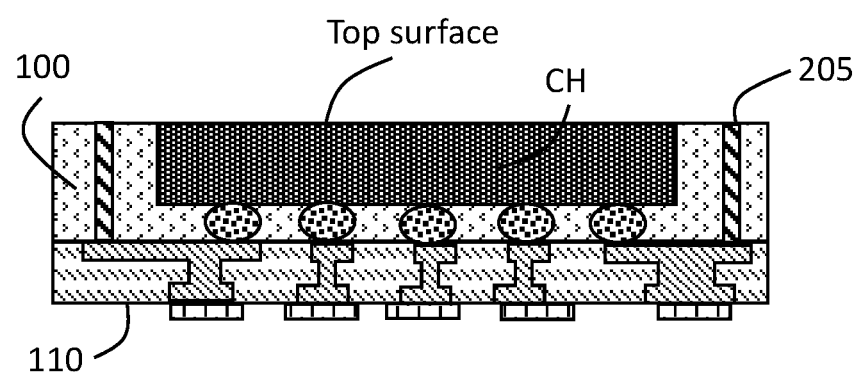
Figure 6E:
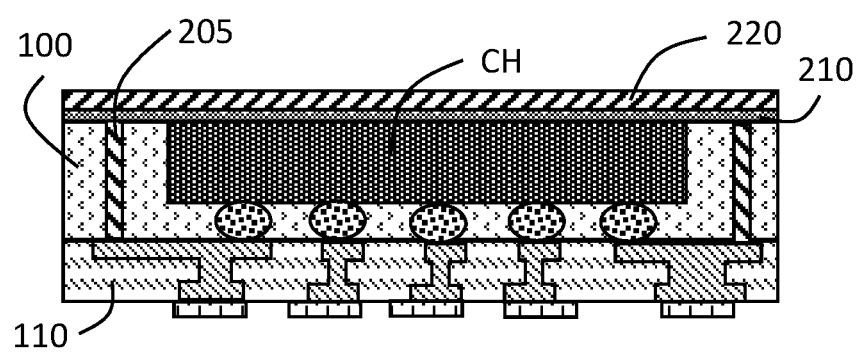
Figure 6F:
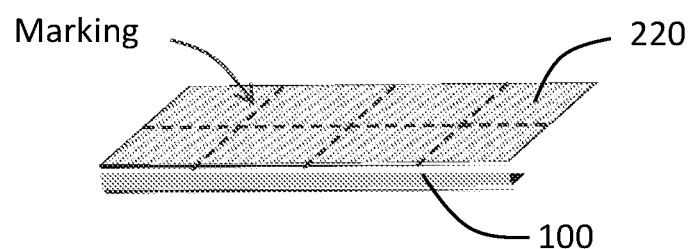
Figure 6G:
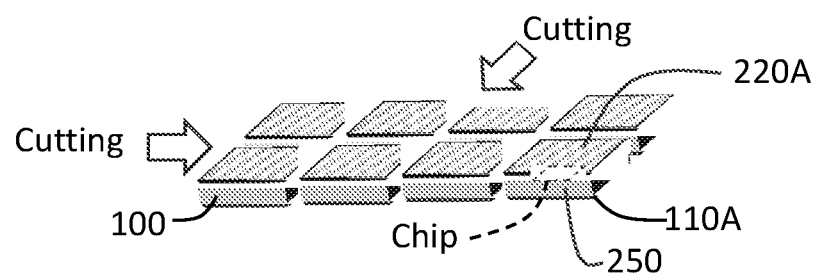
Figure 7A:
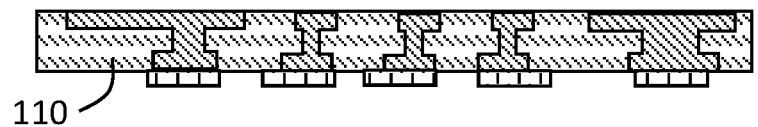
FIGS. 7A to 7C show manufacturing steps of a chip packaging method according to another embodiment of the present invention.
Figure 7B:
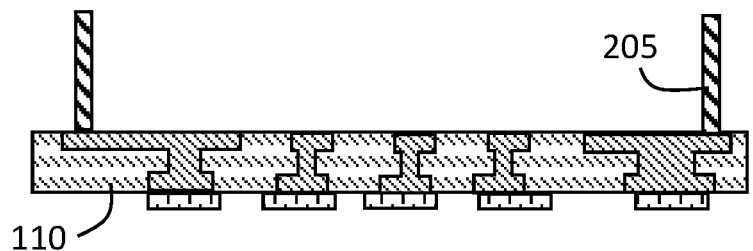
Figure 7C:
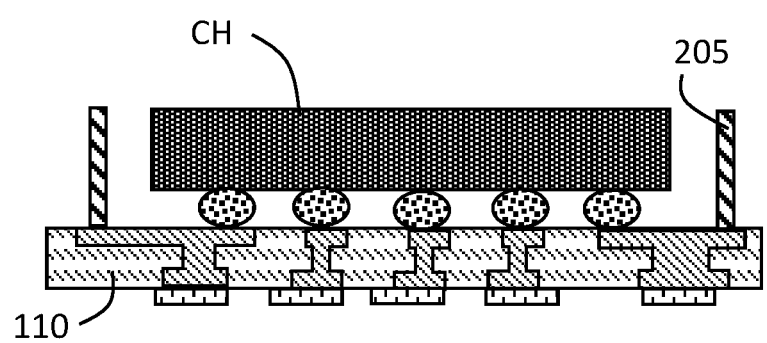

FIGS. 6A to 6G show manufacturing steps of a chip packaging method according to an embodiment of the present invention, and FIGS. 7A to 7C show manufacturing steps of a chip packaging method according to another embodiment of the present invention. After FIGS. 7A to 7C the second embodiment proceeds with the steps of FIGS. 6D to 6G.

Please refer to the figures, the chip packaging method of the present invention includes the following steps. First, a base material 110 is provided (FIG. 6A, 7A), wherein the base material 110 includes plural finger contacts (the figures show the cross-sections of the finger contacts, wherein several example of the geometric shapes of the finger contacts are shown). The finger contacts can be floating, or connected to wirings in the base material 110. Next, referring to FIGS. 6B-6C and 7B-7C, a chip unit CH is mounted on the base material 110 by flip chip mounting technology (wherein the signal contacts of the chip unit CH are disposed between the chip unit CH and the base material 110) and plural vertical heat conduction elements 205 are formed on the base material 110 to surround the chip unit CH, wherein the vertical heat conduction elements 205 are disposed on the corresponding finger contacts, so as to be thermally connected to the base material 110 via the finger contacts to form at least one heat transfer path downward from the chip unit CH. Next, referring to FIG. 6D, a package material 100 is provided to encapsulate the base material 110, the chip unit CH and the vertical heat conduction elements 205, wherein the package material 100 fills the space between the base material 110, the chip unit CH and the vertical heat conduction elements 205. The package material 100 may cover the top surface of the chip unit CH or does not cover the top surface of the chip unit CH (in the embodiment of FIG. 6D, the package material 100 does not cover the top surface of the chip unit CH; in the embodiment of FIG. 8, the package material 100 covers the top surface of the chip unit CH). Next, referring to FIG. 6E, an adhesive layer 210 is provided to adhere a metal film 220 on the package material 100, so as to form a package structure which includes the chip unit CH, the vertical heat conduction elements 205, the base material 110, and the metal film 220. Next, referring to FIGS. 6F and 6G, the package structure is cut (or separated) (FIGS. 6F and 6G) into plural chip package units 250, wherein each of the chip package units 250 includes the chip unit CH, plural vertical heat conduction elements 205 surrounding the chip unit CH, a portion of the base material 110 (in-package base material 110A), and a portion of the metal film 220 (in-package base metal film 220A). In the above description and figures, FIGS. 6A-6E and FIGS. 7A-7C only show the steps corresponding to one of the chip package units 250.

In the chip package unit 250, the heat generated in the chip unit CH can be transferred to the outside of the chip package unit 250 through the in-package base material 110A and the in-package base metal film 220A. The vertical heat conduction elements 205 can further enhance the heat transfer performance from the chip unit CH to the in-package base material 110A and the in-package metal film 220A. One advantage of the present invention is that the method of the present invention can be applied to various different sizes of the chip package units without requiring a metal cap which needs to be manufactured by a complicated process and can be applied to only one size of chip package unit, and the present invention does not require wirings similar to those in the prior art, to provide the high heat transfer performance.

In one embodiment, the base material 110 may be a lead frame. In one embodiment, the lead frame may be a portion of a lead frame stripe. In one embodiment, the base material 110 may be a printed circuit board (PCB). In one embodiment, the printed circuit board may be a part of a vast printed circuit board before depanelization.

Typically, the lead frame is used in quad flat no lead (QFN) package and small outline package (SOP); the printed circuit board is used in ball grid arrays (BGA) package, land grid array (LGA) package, and chip scale package (CSP); these package technologies are well-known to those with ordinary skill in the art, so the related details are not redundantly explained here.

The vertical heat conduction elements 205 in the present invention can be made of metal, to efficiently transfer the heat generated in the chip unit CH to the outside of the chip package unit 250 via the in-package base material 110A and the in-package metal film 220A. The vertical heat conduction element 205 can be a pillar or column protrusion structure with any geometric cross-section shape, such as a circle, oval, square, triangular, rectangular shape, etc.

In different embodiments, the steps of disposing the chip unit CH on the base material 110 and disposing the vertical heat conduction elements 205 surrounding each chip unit CH, may be arranged in different orders. For example, the chip unit CH is first disposed on the base material 110, and thereafter the vertical heat conduction elements 205 are disposed to surround each chip unit CH on the base material 110 (FIGS. 6B and 6C), or, the vertical heat conduction elements 205 are first disposed on the base material 110, and thereafter the chip unit CH is disposed at a place surrounded by the vertical heat conduction elements 205 on the base material 110 (FIGS. 7B and 7C). Either order is doable and within the scope of the present invention.

The surface areas of the in-package metal film 220A and the in-package base material 110A, are substantially equal to the top and bottom areas of the chip package unit 250. (The term "substantially" means that an insignificant error is tolerable.) In this way, the chip package unit 250 can have top and bottom areas with the largest heat dissipation area. When the chip unit CH in the chip package unit 250 is operating, the in-package metal film 220A and the in-package base material 110A can provide benefits of high heat dissipation efficiency, increasing heat dissipation area, reducing heat concentration, and achieving better heat dissipation distribution. In one embodiment, the adhesive layer 210 includes an adhesive material with high heat conduction performance. The in-package metal film 220A is disposed on the chip unit CH via the adhesive layer 210. The heat generated in the operating chip unit CH can be transferred to the in-package metal film 220A via the adhesive layer 210, and then transferred to the outside of the chip package unit 250.

Figure 8:
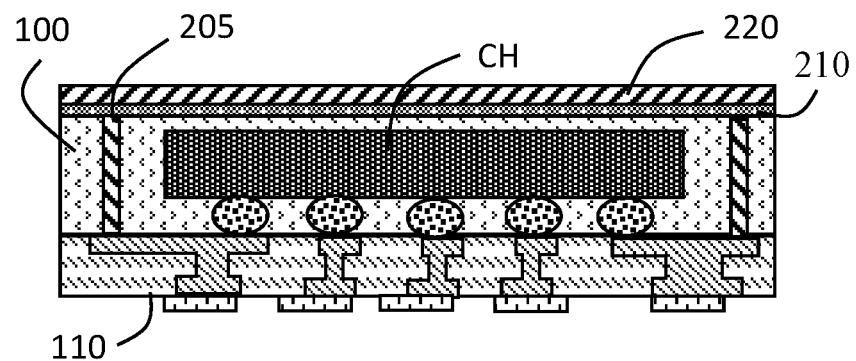
FIGS. 8 and 9 show schematic diagrams of chip package units according to two embodiments of the present invention.

In the present invention, whether the adhesive layer 210 contacts the top surface of the chip unit CH, can be decided according to whether the package material 100 covers the top surface of the chip unit CH (the top surface refers to the upper side in the figures, which opposite to the side of the chip unit CH facing the base material 110). For example, in one embodiment, the package material 100 covers the top surface of the chip unit CH, the adhesive layer 210 does not contact the top surface of the chip unit CH, and the adhesive layer 210 contacts the package material 100 on the top surface of the chip unit CH (FIG. 8). The heat generated in the chip unit CH in the chip package unit 250 is transferred to the metal film 220, via the package material 100 and the adhesive layer 210 on the top surface of the chip unit CH. In another embodiment, the package material 100 does not cover the top surface of the chip unit CH, such that the adhesive layer 210 can contact the top surface of the chip unit CH (FIG. 6E), the heat generated in the chip unit CH in the chip package unit 250 can be directly transferred to the metal film 220 via the adhesive layer 210.

In one embodiment, the step of cutting the package structure into the chip package units 250 includes: baking the adhesive layer 210 to fix the metal film 220 on the chip unit CH to strengthen the adhesion between the metal film 220 and the chip unit CH. In another embodiment, the step of cutting the package structure into the chip package units 250, further includes: providing markings (FIG. 6F) on the package structure for positioning the cutting lines between the chip package units to be separated.

FIG. 6G shows that the package structure is separated into multiple chip package units 250. This cutting process is a known technology, so the details thereof are not redundantly explained here.

In one embodiment, the vertical heat conduction elements 205 contact the adhesive layer 210 or the metal film 220. The vertical heat conduction elements 205 may be connected to the metal film 220 by means of the adhesive layer 210; or, the vertical heat conduction elements 205 may penetrate through the adhesive layer 210 to directly contact the metal film 220. Such variations are within the spirit of the present invention and can be implemented as desired.

In the present invention, the thermal contacts between the base material 110, the vertical heat conduction elements 205 and the metal film 220, can form a high efficiency heat transfer mechanism, which is different from the Faraday cage in the prior art. It is noteworthy that the vertical heat conduction elements 205 and the metal film 220 does not need to be grounded nor connected for signal transmission.

From another aspect, as shown in FIGS. 6E and 8, the present invention provides a chip package unit, including: a base material 110, which includes plural finger contacts; a chip unit CH, disposed on the base material 110 by flip chip mounting technology; plural vertical heat conduction elements 205, disposed on the finger contacts and surrounding the chip unit CH; a package material 100, encapsulating the base material 110, the chip unit CH and the vertical heat conduction elements 205, wherein the package material 100 fills a space between the base material 110, the chip unit CH and the vertical heat conduction elements 205; and an adhesive layer 210 and a metal film 220, wherein the metal film 220 is adhered to the package material 100 by the adhesive layer 210.

Regarding the details of the relationships among the base material 110, the chip unit CH, the vertical heat conduction elements 205, the package material 100, the adhesive layer 210 and the metal film 220, please refer to the description of the aforementioned embodiments of the present invention, which are not repeated here.

The technology of the chip packaging method or chip package unit provided by the present invention, can be used in ball grid array package (BGA), land grid array package (LGA), chip unit size package (CSP), Quad flat no lead package (QFN), or small outline package (SOP).

Figure 9:
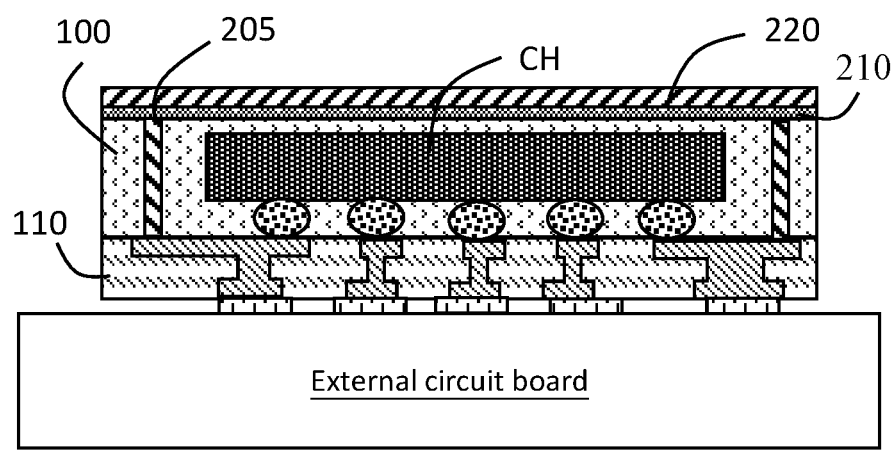

Please refer to FIG. 9, in one embodiment wherein the base material 110 includes a lead frame, the chip package unit 250 can be mounted on an external circuit board for transmitting/receiving signals to/from the external circuit board.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A chip packaging method, including:
providing a base material, which includes a plurality of finger contacts;
disposing a plurality of chip units on the base material and disposing a plurality of vertical heat conduction elements on the base material to surround each of the chip units, the chip units being mounted on the base material by flip chip mounting technology, and the vertical heat conduction elements are respectively disposed on and in contact with the corresponding finger contacts;
providing a package material, to encapsulate the base material, the chip units and the vertical heat conduction elements;
adhering a metal film on the packaging material via an adhesive layer, to form a package structure; and
cutting the package structure into a plurality of chip package units, wherein each of the chip package units includes one of the chips, a portion of the base material, a portion of the metal film, and a portion of vertical heat conducting elements surrounding the chip.

2. The chip packaging method according to claim 1, wherein the base material includes a lead frame or a printed circuit board.

3. The chip packaging method according to claim 2, wherein the base material includes the lead frame, and each of the chip package units is mounted on an external circuit board.

4. The chip packaging method according to claim 2, wherein the base material includes the lead frame, and the lead frame is a portion of a lead frame stripe.

5. The chip packaging method according to claim 1, wherein material of the vertical heat conduction element includes a metal material.

6. The chip packaging method according to claim 1, wherein the steps of disposing the chip units and disposing the vertical heat conduction elements surrounding the chip units are performed by either order: first disposing the chip units and thereafter disposing the vertical heat conduction elements surrounding the chip units, or first disposing the vertical heat conduction elements and thereafter disposing the chip units in areas surrounded by the vertical heat conduction elements.

7. The chip packaging method according to claim 1, wherein a surface area of the metal film after cutting is substantially equal to a top area of the chip package unit.

8. The chip packaging method according to claim 1, wherein the adhesive layer contacts each of the chip units, to adhere the metal film to the package material and each of the chip units.

9. The chip packaging method according to claim 1, wherein the step of cutting the package structure into the chip package units, further includes: providing markings on the package structure for positioning the cutting lines between the chip package units to be separated.

10. The chip packaging method according to claim 1, wherein the vertical heat conduction elements are in contact with the adhesive layer or the metal film.

11. A chip package unit, including:
a base material, including a plurality of finger contacts;
a chip unit, disposed on the base material by flip chip mounting technology;
a plurality of vertical heat conduction elements, disposed on the finger contacts and surrounding the chip unit;
a package material, encapsulating the base material, the chip unit and the vertical heat conduction elements; and
an adhesive layer and a metal film, the metal film being adhered to the package material by means of the adhesive layer.

12. The chip package unit according to claim 11, wherein the vertical heat conduction elements contact the adhesive layer or the metal film.

13. The chip package unit according to claim 11, wherein the chip package unit is used in ball grid array (BGA) package, land grid array (LGA) package, chip scale package (CSP), quad flat no lead (QFN) package, or small outline package (SOP).

\* \* \* \* \*